United States Patent
Lee et al.

(10) Patent No.: US 6,982,471 B2
(45) Date of Patent: Jan. 3, 2006

(54) SEMICONDUCTOR MEMORY DEVICE

(75) Inventors: Kang Seol Lee, Seoul (KR); Ji Hoon Lee, Gyeonggi-do (KR)

(73) Assignee: Hynix Semiconductor Inc., Gyeonggi-do (KW)

(*) Notice: Subject to any disclaimer, the term of this patent is extended or adjusted under 35 U.S.C. 154(b) by 0 days.

(21) Appl. No.: 10/738,086

(22) Filed: Dec. 18, 2003

(65) Prior Publication Data
US 2004/0232518 A1    Nov. 25, 2004

(30) Foreign Application Priority Data
May 24, 2003    (KR)    .................... 10-2003-0033158

(51) Int. Cl.
*H01L 29/00*    (2006.01)
(52) U.S. Cl. .............. 257/529; 257/202; 257/208; 257/209; 257/259; 438/22; 438/130; 438/132
(58) Field of Classification Search ............. 365/63, 365/200, 225.7, 230.03; 438/22, 130, 132; 257/202, 208, 209, 259, 529
See application file for complete search history.

(56) References Cited

U.S. PATENT DOCUMENTS 6,353,570 B2 * 3/2002 Hwang et al. ........... 365/225.7
6,541,290 B1 * 4/2003 Bang et al. .................. 438/22

* cited by examiner

*Primary Examiner*—Mai-Huong Tran
(74) *Attorney, Agent, or Firm*—Heller Ehrman LLP

(57) ABSTRACT

The present invention relates to a semiconductor memory device including a fuse box wherein the layout of a fuse box used to control a memory cell array is improved, a fuse box is divided into a plurality of blocks, and an index mark is applied to every fuse box or to every block so that a user may recognize each fuse box. In an embodiment, there is provided a semiconductor memory device including a fuse box comprising a plurality of cell matrices and a fuse box. The plurality of cell matrices are arranged adjacently each other. The fuse box is defined by a fuse barrier layer formed at a side of the plurality of cell matrices, wherein the fuse box comprises a plurality of cell matrices, wherein the fuse box comprises a plurality of fuses shared by the plurality of cell matrices, and the fuse barrier layer is configured to have a length long enough to be shared by the plurality of cell matrices.

14 Claims, 5 Drawing Sheets

SEMICONDUCTOR MEMORY DEVICE

CORRESPONDING RELATED APPLICATIONS

The present application claims the benefit of and priority to Korean Patent Application No. 10-2003-0033158, filed on May 24, 2003.

BACKGROUND OF THE INVENTION

1. Field of the Invention

The present invention generally relates to a semiconductor memory device including a fuse box, and more specifically, to a semiconductor memory device including a fuse box wherein the layout of a fuse box used to control a memory cell array is improved, a fuse box is divided into a plurality of blocks, and an index mark is applied to every fuse box or to every block so that a user may recognize each fuse box.

2. Description of the Prior Art

Due to development of semiconductor process technology, the size of a unit cell in a semiconductor memory device decreases, which results in reduction of the size of cell matrix.

A semiconductor memory device comprises a cell matrix and a fuse box corresponding to the cell matrix. The fuse box is used for repair or test.

Conventionally, the size of the cell matrix and the fuse box relatively do not matter when the layout of the cell matrix and the fuse box is determined.

As shown in FIG. 1, a row of a fuse box 12 is arranged in each cell matrix 10. Power meshes 14 are arranged at both ends of the fuse box 12. A cutting area 16 is defined inside of the fuse box 12. The fuse box area 12 is defined by a fuse barrier layer 18 wherein fuses are formed.

As the unit cell becomes smaller, the size of the cell matrix 10 becomes smaller. However, there is little change in the size of the fuse box 12 due to its material.

As a result, the size of the cell matrix 10 becomes relatively smaller than that of the fuse box 12, and the layout of the fuse box 12 should be changed to overcome the relative disproportion in size.

SUMMARY OF THE INVENTION

Accordingly, it is an object of the present invention to arrange a fuse box corresponding to at least two or more cell matrices smaller than the fuse box, to match the fuse box to a plurality of cell matrices, and to share the fuse box in the plurality of corresponding cell matrices.

It is another object of the present invention to divide a fuse into several blocks according to a predetermined number or usage of blocks so that a user may easily recognize fuses comprised in the fuse box, and to apply an index mark to a block for identifying each block.

It is still another object of the present invention to apply a different index mark in each fuse box in order for a user to recognize fuse boxes when a plurality of fuse boxes are formed in a plurality of rows.

In an embodiment, there is provided a semiconductor memory device including a fuse box comprising a plurality of cell matrices and a fuse box. The plurality of cell matrices are arranged adjacently each other. The fuse box is defined by a fuse barrier layer formed at a side of the plurality of cell matrices, wherein the fuse box comprises a plurality of fuses shared by the plurality of cell matrices, and the fuse barrier layer is configured to have a length long enough to be shared by the plurality of cell matrices.

Preferably, the fuses included in the fuse box are divided into a plurality of blocks, and an index mark corresponding to the block is formed to have different shapes according to the fuse boxes. As a result, the fuses may be easily recognized with a shape of the index mark.

When a plurality of fuse boxes are formed in a plurality of rows, an index mark may be formed in each fuse box. The index mark may be used for identification of fuse boxes.

DETAILED DESCRIPTION OF THE PREFERRED EMBODIMENTS

In an embodiment, a fuse box is matched with two or more cell matrices, and the fuse box is shared in the cell matrices.

Figure 1:
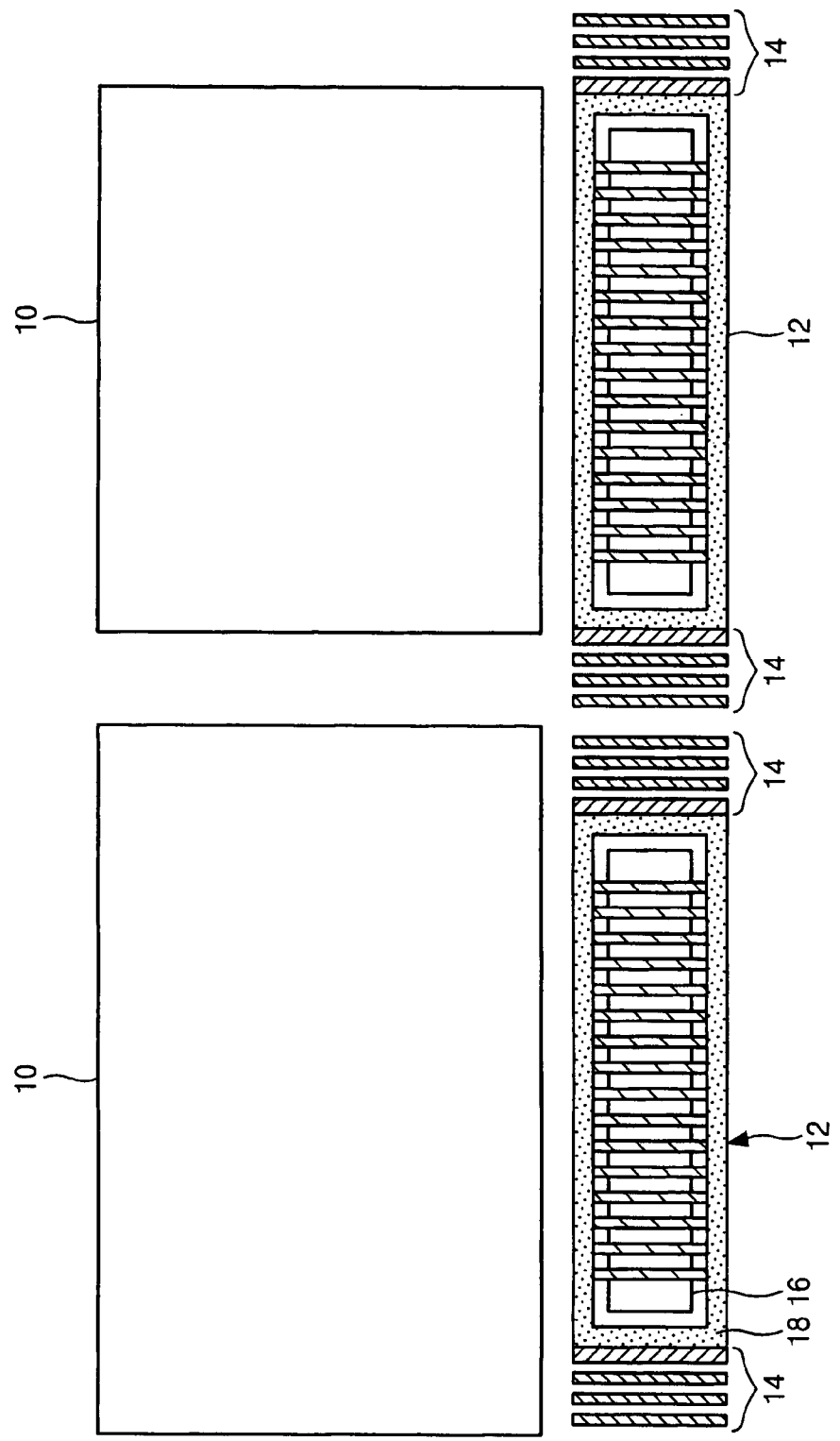
FIG. 1 is a block diagram illustrating the layout of a fuse configured in a conventional semiconductor memory device including a fuse box.
Figure 2:
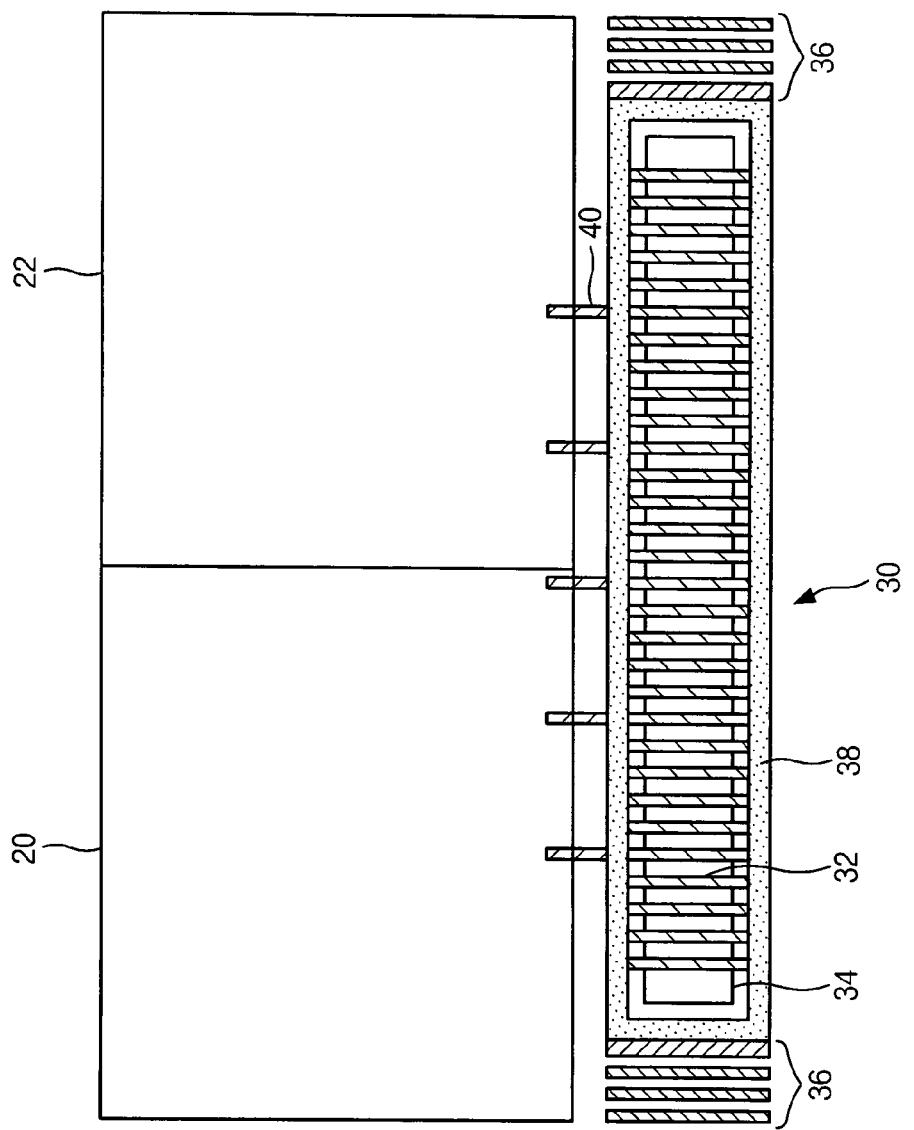
FIG. 2 is a block diagram illustrating the layout of a fuse configured in a semiconductor memory device including a fuse box according to an embodiment of the present invention.

FIG. 2 shows an embodiment wherein a fuse box is matched with two cell matrices. However, an embodiment wherein a fuse box is matched with three or more cell matrices may be exemplified.

Referring to FIG. 2, a cell matrix 20 is arranged adjacent to a cell matrix 22. A fuse box 30 is arranged separately from the cell matrices 20 and 22.

Although the cell matrices 20 and 22 are not shown specifically, each cell matrix comprises unit cells including an array and its adjacent circuit for reading/writing data. Each cell matrix 20 and 22 may be configured to be adjacent with each other as shown in FIG. 2. Otherwise, the cell matrix 20 may be formed having an interval where a power line region is formed.

The fuse box 30 comprises a plurality of fuses 32 including fuses cut and used for test and other fuses for repair on fail cells. A cutting area 34 for cutting is defined in the fuse box 30.

Each fuse in the fuse box 30 is defined by a fuse barrier layer 38.

The fuse box 30 is located apart from a side of the two adjacent cell matrices 20 and 22 by a predetermined distance. The region of the fuse box 30 is set to have an extended length, each adjacent to the side portion of the two cell matrices 20 and 22. Power meshes 36 are formed in a region which the side portion of the cell matrices 20 and 22 is not adjacent to the fuse box 30.

A number of fuses 32 are required in the fuse box 30 to be shared by the two cell matrices.

As the number of fuses 32 in the fuse box 30 becomes larger, it is difficult for a user to recognize each fuse 32. When a predetermined fuse 32 is identified to perform a desired cutting operation, it is difficult to recognize the precise location of a corresponding fuse 32.

In order to solve the above problem, an index mark 40 is comprised as shown in FIG. 2.

The index mark 40 may be formed of a metal line on the upper layer where a fuse is formed. Here, it is preferable that the index mark 40 has a discernible shape and size.

Referring to FIG. 2, fuses included in the fuse box 30 are divided into blocks. By a unit of block, the index mark 40 is formed to correspond to locations where a count operation starts or ends.

The fuse box 30 may be divided into blocks using the same number of fuses or the different number of fuses. If fuses need be divided according to their usage, blocks may be set so that fuses may be divided according to their usage such as test or repair. The divided fuses according to their usage may be divided into sub blocks again according to a predetermined number of fuses. The index mark 40 may be formed to correspond to the sub blocks.

Figure 3:
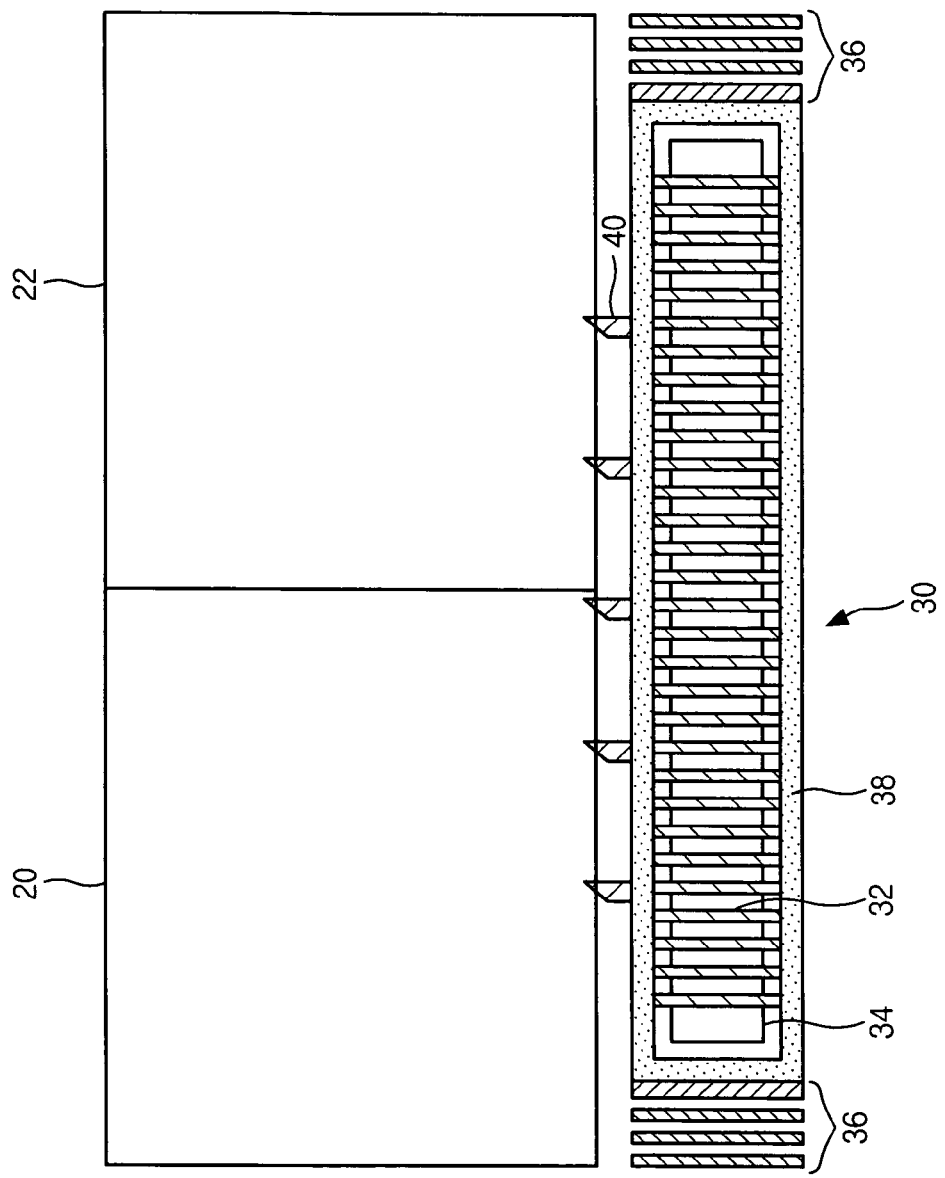
FIG. 3 is a block diagram illustrating the layout of a fuse configured in a semiconductor memory device including a fuse box according to another embodiment of the present invention.

The index mark 40 may be formed to have a rectangular rod shape as shown in FIG. 2 or to have a slope side on its end portion as shown in FIG. 3.

The index mark 40 may be formed in space between the fuse box 30 and the cell matrices 20 and 22. Otherwise, the index mark 40 may be formed in the opposite side of the cell matrices 20 and 22.

The index mark 40 may be applied in the whole fuse box 30 by a unit of block or may be applied to have two or more different shapes in order to be classified by its usage such as repair or test or by a unit of the number of fuses.

Figure 4:
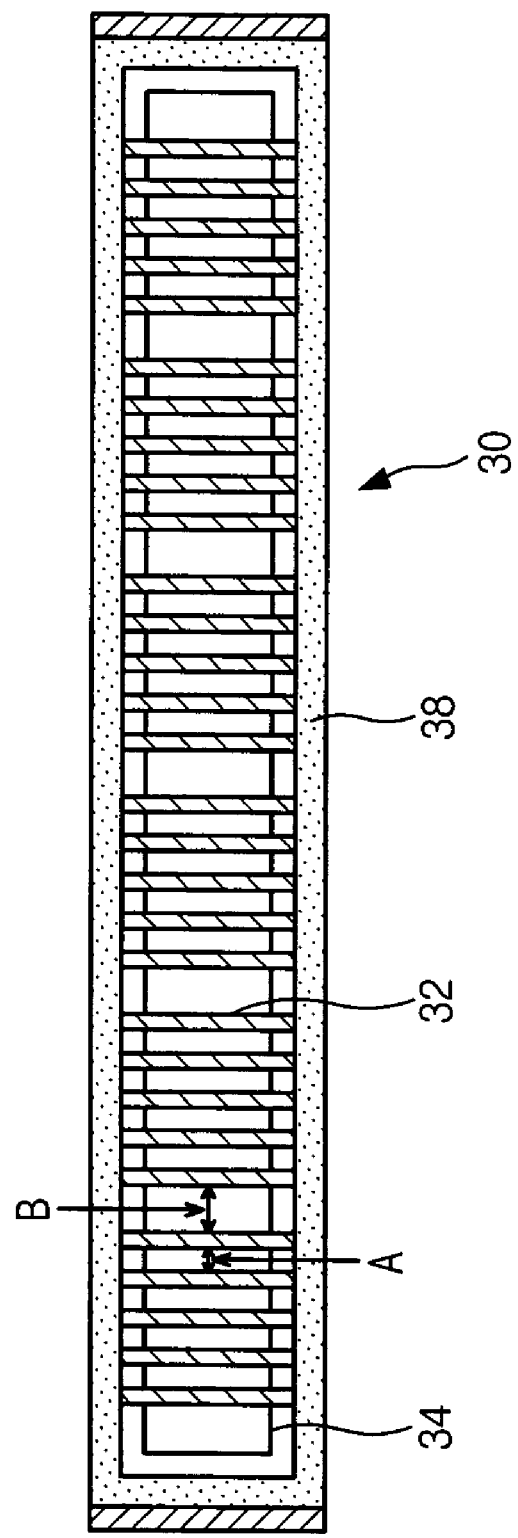
FIG. 4 is a block diagram illustrating the layout of a fuse configured in a semiconductor memory device including a fuse box according to still another embodiment of the present invention.

The index mark 40 may be embodied by differentiating the distance between the fuses 32 by a unit of block as shown in FIG. 4.

The space between the fuses 32 in the fuse box 30 is made to be "A", and the space between the fuses located for identification of blocks is made to be "B". The space "B" serves as an index mark.

As the number of fuses becomes larger, more fail cells can be repaired, which results in improvement of yield of semiconductor devices. However, the area becomes larger in proportion to the yield in order to receive the increased number of fuses, which results in reduction of net die. A semiconductor device is designed so that the area occupied by the fuse box is maintained at a predetermined standard.

Figure 5:
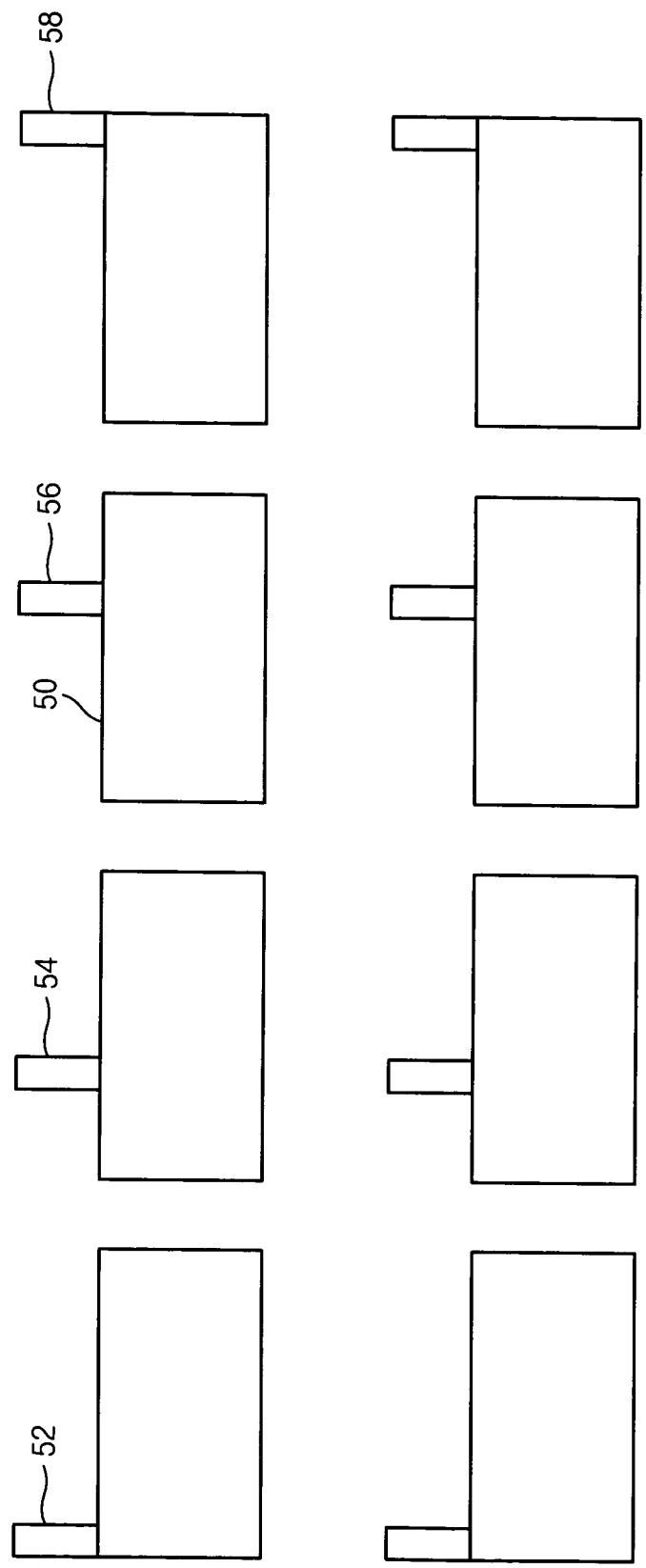
FIG. 5 is a block diagram illustrating the layout of a fuse configured in a semiconductor memory device including a fuse box according to still another embodiment of the present invention.

As a semiconductor memory device becomes smaller, a large number of fuses should be received in the semiconductor memory device. As shown in FIG. 5, a fuse may be divided into a plurality of fuse boxes 50 in order to receive the large number of fuses.

In this case, an index mark may be comprised in each fuse box 50.

Referring to FIG. 5, eight fuse boxes 50 are arranged in two rows. Index marks 52, 54, 56 and 58 are comprised on each fuse box 50 in the same direction.

The index marks 52, 54, 56 and 58 may be formed on different locations in each fuse box 50 so that a user may easily recognize the usage and locations of the fuse box.

When the fuse box 50 is formed in two or more rows, an index mark for classification according to the usage and locations of the fuse box may be embodied. Specifically, a method for forming an index mark having different shapes according to the fuse boxes 50 may be provided. Also, an index mark may be applied to the fuse box 50 to be recognized.

In an embodiment, the index mark is not limited in recognition by naked eyes of users but used for mechanical recognition.

For example, an image-sensed index mark may be used for precise reading locations of fuses to be cut. A fuse cutting process may comprises the steps of: recognizing an index mark by image-sensing and reading locations of fuses to be cut; setting fuse cutting apparatus for cutting fuses; and cutting corresponding fuses.

The detailed examples of the above embodiment wherein an index mark is applied to common image-sensing are omitted herein. However, it is obvious that the examples can be achieved by a person who understands the technology of the present invention.

Accordingly, in an embodiment of the present invention, a fuse box is configured to be matched and shared by a plurality of cell matrices, which enables the effective design in consideration of the relative size.

In addition, a fuse box is divided into a predetermined number of blocks or by usage. Here, index marks for identification of blocks enable users to easily recognize locations of fuses.

When a plurality of fuse boxes are arranged in a plurality of rows, index marks may be applied. In this case, classification of fuse boxes may be easily recognized by naked eyes.

As a result, time required for fuse cutting may be reduced because locations of fuses to be cut can be rapidly recognized.

What is claimed is:

1. A semiconductor memory device including a fuse box comprising:
   a plurality of cell matrices arranged adjacently to each other;
   a fuse box defined by a fuse barrier layer formed at a side of the plurality of cell matrices, wherein the fuse box comprises a plurality of fuses shared by the plurality of cell matrices and, divided into a plurality of blocks, the fuse barrier layer is configured to have a length long enough to be shared by the plurality of cell matrices; and
   an index mark corresponding to each of the plurality of blocks is formed adjacent to the fuse box.

2. The device according to claim 1, wherein the index mark is formed of a metal line formed on an upper layer where the fuse is formed.

3. The device according to claim 1, wherein the index mark is formed in a space between the fuse box and the plurality of cell matrices.

4. The device according to claim 1, wherein the index mark is formed to have a rectangular rod shape.

5. The device according to claim 4, wherein the index mark is formed to have a slope on its end portion.

6. The device according to claim 4, wherein at least one or more sides of the index mark have a nonlinear shape.

7. The device according to claim 1, wherein the index mark is configured to have the same shape in each block.

8. The device according to claim 1, wherein the index mark has a different shape according to each of the plurality of the blocks.

9. The device according to claim 1, wherein fuses included in the fuse box are divided into a plurality of blocks, intervals between the fuses are configured to be different from those between the blocks, and the intervals between the blocks are used as index marks.

10. The device according to claim 1, wherein the plurality of the fuse boxes are arranged in a plurality of rows, and an index mark is formed on a predetermined location of each fuse box.

11. The device according to claim 10, wherein the index mark is formed on a different location in each fuse.

12. The device according to claim 10, wherein the index mark is comprised in a predetermined fuse box to be recognized.

13. The device according to claim 10, wherein the index mark has a different shape according to the fuse box.

14. The device according to claim 13, where the index mark is formed on a different location in each fuse box.

* * * * *